(12) United States Patent
Nishi

(10) Patent No.: US 8,392,801 B2
(45) Date of Patent: Mar. 5, 2013

(54) DECODING DEVICE AND CODING SYSTEM

(75) Inventor: Takashi Nishi, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 494 days.

(21) Appl. No.: 12/690,884

(22) Filed: Jan. 20, 2010

(65) Prior Publication Data

US 2010/0241924 A1    Sep. 23, 2010

(30) Foreign Application Priority Data

Mar. 17, 2009    (JP) .................................. 2009-063796

(51) Int. Cl.
*H03M 13/00* (2006.01)
*H04N 7/12* (2006.01)
*H04Q 1/20* (2006.01)

(52) U.S. Cl. ........ 714/774; 714/755; 714/758; 714/752; 714/799; 714/821; 375/240.12; 375/224; 375/240.27; 375/240.24; 370/216; 370/241; 370/242; 348/394.1; 348/180; 348/192

(58) Field of Classification Search .................. 714/774, 714/755, 758, 752, 799, 821; 375/240.12, 375/224, 240.27, 240.24; 370/216, 241, 370/242; 348/394.1, 180, 192
See application file for complete search history.

(56) References Cited

U.S. PATENT DOCUMENTS

| | | | | |
|---|---|---|---|---|
| 4,794,455 A * | 12/1988 | Ericsson | ................. | 375/240.14 |
| 5,265,180 A * | 11/1993 | Golin | ........................... | 382/236 |
| 5,446,747 A * | 8/1995 | Berrou | ......................... | 714/788 |
| 6,130,859 A * | 10/2000 | Sonnenschein et al. | ...... | 367/134 |
| 6,714,264 B1 * | 3/2004 | Kempisty | ..................... | 348/732 |
| 7,388,781 B2 * | 6/2008 | Litsyn et al. | ............. | 365/185.09 |
| 7,669,104 B2 * | 2/2010 | Uchida et al. | ................. | 714/755 |
| 7,894,521 B2 * | 2/2011 | Hannuksela | ............ | 375/240.12 |
| 8,204,134 B2 * | 6/2012 | Hannuksela | ............ | 375/240.27 |
| 2002/0023247 A1 * | 2/2002 | Akiyama et al. | .............. | 714/758 |

FOREIGN PATENT DOCUMENTS

WO    WO-2009/005047 A1    1/2009

OTHER PUBLICATIONS

Anne Aaron, Shantanu Rane, Eric Setton, and Bernd Girod, "Transform-domain Wyner-Ziv Codec for Video", In: Proc. SPIE Visual Communications and Image Processing, San Jose, CA, 2004.
Bernard Sklar, "Digital Communications: Fundamentals and Applications, Second Edition" published by Pearson Education, Inc., publishing as Prentice Hall Inc., Copyright 2001 by Prentice-Hall PTR.
Japanese Office Action dated Oct. 2, 2012 with English translation.

* cited by examiner

*Primary Examiner* — John J Tabone, Jr.
(74) *Attorney, Agent, or Firm* — Rabin & Berdo, P.C.

(57) ABSTRACT

A decoding device is provided, which can minimize the number of coded data addition requests by the decoding device, reduce processing time to prevent delay, and minimize frame rate reduction. The decoding device performs data reproduction by performing error correction of data of a predicted image using coded data which is an error correction code generated based on original data. The decoding device includes a coded bit receiving part, a preset value generating/updating part, a decoding part that performs a decoding process based on a preset value or a predicted value, and coded bits, and a bit addition request determining part that determines whether or not there is a need to request additional coded bits from decoding process results from the decoder. When it is determined to perform a decoding process with additional coded data, the preset value generating/updating part updates the preset value based on previous decoding process results.

10 Claims, 8 Drawing Sheets

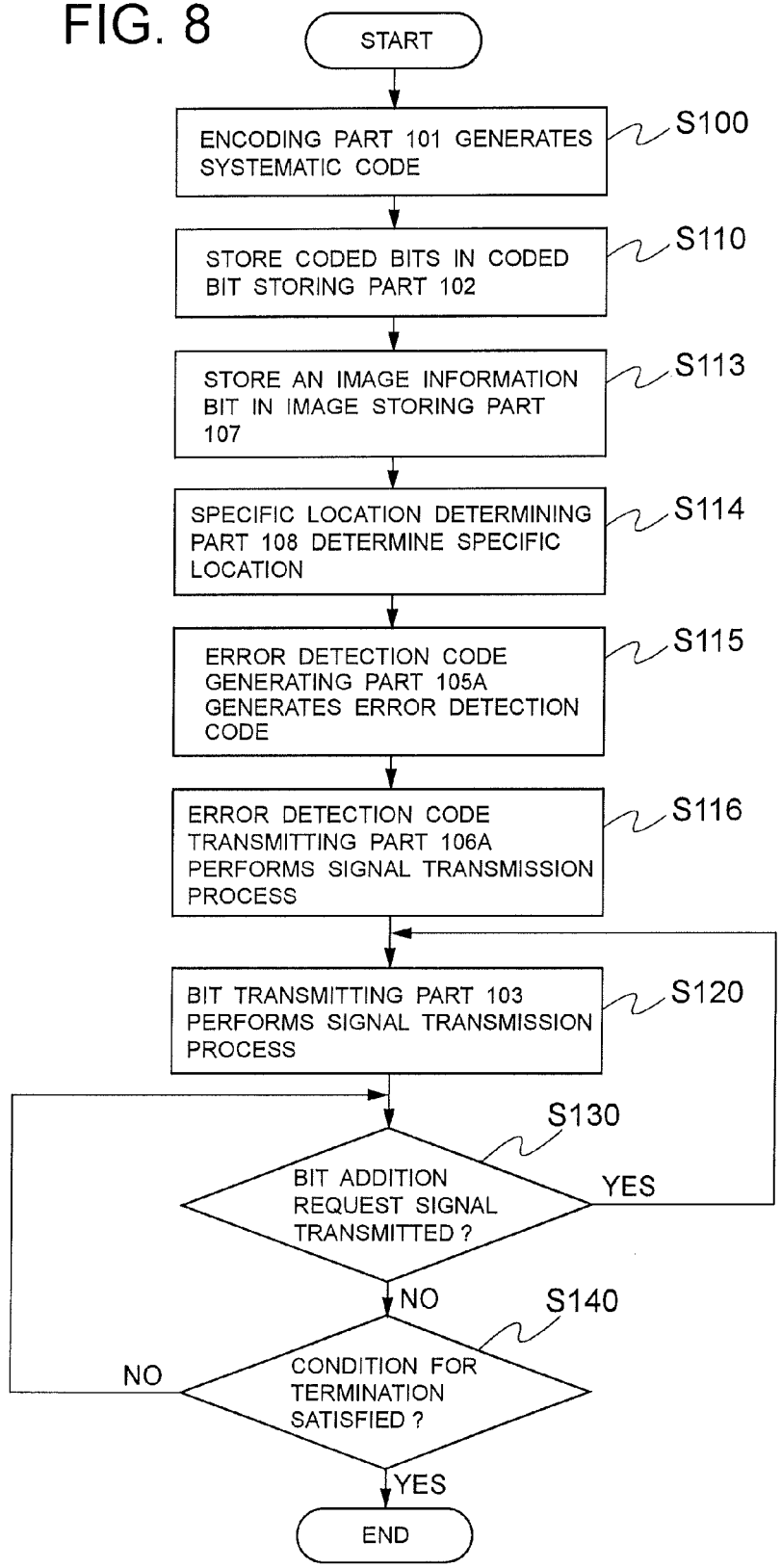

DECODING DEVICE AND CODING SYSTEM

BACKGROUND OF THE INVENTION

1. Field of the Invention

The present invention relates to a device for encoding and decoding data such as moving image data and a processing system for the same, and more particularly to a device that performs encoding and decoding processes on data using error correction.

2. Description of the Related Art

For example, it is desirable to decrease the amount of data associated with transmission in order to efficiently perform communication of a signal including data such as moving image data through an electronic communication line or the like. Hereinafter, the data such as moving image data will be referred to as "image data". Therefore, an encoding side (or transmitting side) performs a process for encoding image data and transmits a signal including encoding-related data (specifically, encoded data). On the other hand, a decoding side (or receiving side) receives a signal including the encoded data to reproduce (or regenerate) the data such as moving image data.

In one example method, image data is encoded using Distributed Video Coding (DVC), which is also referred to as "Distributed Source Coding (DSC)". For example, see Anne Aaron, Shantaun Rane, Eric Setton, and Bernd Girod, "Transform-domain Wyner-Ziv codec for video," in Proc., SPIE Visual Communications and Image Processing, San Jose, Calif., 2004. DVC is a method for encoding image data based on the Slepian-Wolf theorem. In this method, the theory that, even when two correlated image data elements are independently encoded, they can be compressed with the same efficiency as when they are encoded with reference to each other, provided that the rate is within an allowable range.

For example, frames (images) are grouped in the encoding method using DVC. One of the frames is defined as a key frame and the other frames are defined as non-key frames. When the key frame is encoded in the encoding-side device, encoding (for example, intra-frame encoding) is performed directly on its image data to generate data (hereinafter referred to as "compressed image data") and the compressed image data is transmitted. When each non-key frame is encoded, Discrete Cosine Transform (DCT), quantization, and the like are performed based on its image data to generate image-related data (hereinafter referred to as an "image information bit"). Although the image information bit is described as a single bit, it may also indicate a data sequence or the like without being limited to 1 bit. Coded data of an error correction code of one frame is generated from the image information bit and is then stored. Hereinafter, the coded data is referred to as "coded bits". Here, the image information bit may be assumed to be a pixel fracture or the like. A signal including part of the stored coded bits is then transmitted.

When the key frame is decoded in the decoding-side device, decoding (decompression) is performed based on its compressed image data to reproduce image data. When each non-key frame is decoded, decoding is performed, for example, based on image data of a previous frame to generate image data of a predicted image. A decoding process or the like is performed based on the transmission-related (or transmitted) coded bits, the image data of the predicted image, or the like and an image information bit is then reconstructed based on the result of the decoding process. Then, Inverse Discrete Cosine Transform (IDCT) or the like is performed to reproduce image data. Here, when it is determined that it is not possible to sufficiently reconstruct the image information bit from the result of the decoding process, the decoding-side device requests that the encoding-side device add coded bits. The encoding-side device reselects coded bits for addition based on the request and transmits a corresponding signal. The decoding-side device combines the additional coded bits and the code bit that is already present in the device and again performs a decoding process on the combined coded bits.

Here, a rate controller in the DVC is realized through feedback that is provided from the decoding side to the encoding side. Until it is determined that it is possible to sufficiently perform decoding as described above, the decoding-side device makes (or forms) a coded bit addition request and repeats the decoding process. Therefore, if the number of coded bit addition requests is increased, delay occurs since processing time is increased. This also reduces the frame rate.

SUMMARY OF THE INVENTION

Therefore, the present invention has been made in view of the above problems, and it is an object of the present invention to provide an encoding device, a decoding device, and a coding system which can minimize the number of coded data addition requests that a decoding device makes to an encoding device and thus it is possible to reduce processing time, thereby preventing delay, and can also minimize a reduction in frame rate.

In accordance with the present invention, the above and other objects can be accomplished by the provision of a decoding device that performs data reproduction by performing error correction of predicted data using coded data which is an error correction code generated based on original data, the decoding device including a coded data receiver that receives a signal including transmitted coded data, a prediction value generating part that generates predicted data, a preset value generating/updating part that performs a process for generating or updating a preset value indicating a degree of reliability of error correction, a decoding part that performs a decoding process based on the preset value and the predicted data, and the coded data, and an addition request determining part that performs a process for determining whether or not there is a need to request additional coded data based on a result of the decoding process of the decoding part, wherein the preset value generating/updating part performs the process for updating the preset value based on a result of a previous decoding process if the decoding part determines to perform a decoding process with the additional coded data.

According to the present invention, the preset value generating/updating part updates a preset value used for repeated decoding based on the result of the previous decoding process if it is determined that the decoding part will perform a decoding process with additional coded bits and the decoding part then performs a decoding process using the updated preset value as described above. Therefore, it is possible to perform the decoding process using a preset value that is more reliable than the initially generated and set preset value. Accordingly, it is possible to expect fast convergence of the decoding process and it is thus possible to reduce the amount of the decoding process performed by the decoding part and to reduce processing time. In addition, since it is possible to reduce the number of coded bit addition requests, it is possible to maintain the frame rate.

BRIEF DESCRIPTION OF THE DRAWINGS

The above and other objects, features and other advantages of the present invention will be more clearly understood from the following detailed description taken in conjunction with the accompanying drawings, in which:

FIG. 8 is a flow chart of a procedure performed by a decoding device 110B of Embodiment 3;

DETAILED DESCRIPTION OF THE INVENTION

Embodiment 1

Figure 1:
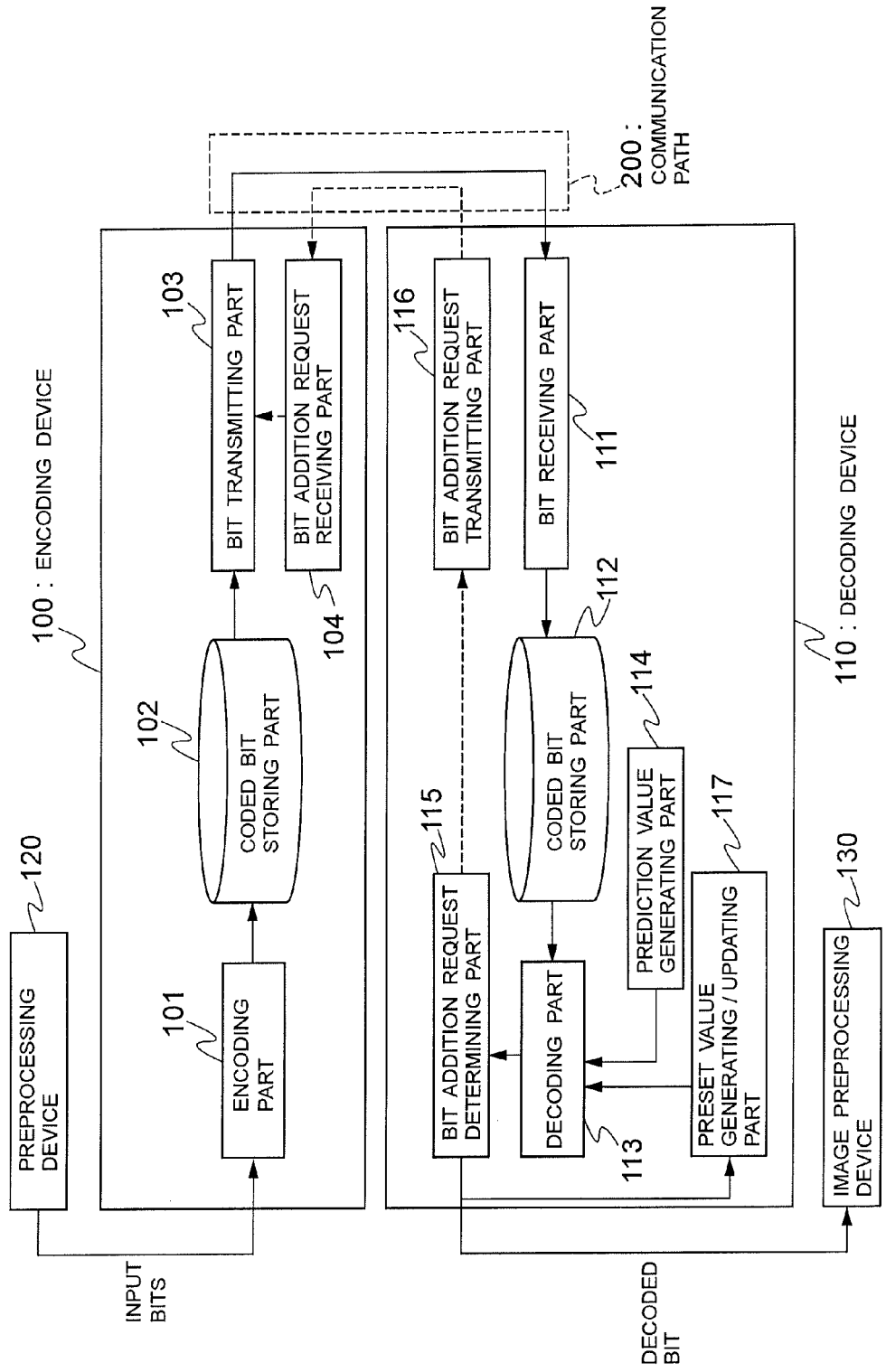
FIG. 1 illustrates a configuration of a coding system according to Embodiment 1.

FIG. 1 illustrates a configuration of a coding system according to Embodiment 1 of the present invention. The coding system of FIG. 1 includes an encoding device 100 that performs an encoding process and a decoding device 110 that reproduces data associated with the encoding process (i.e., encoded data). The encoding device 100 and the decoding device 110 can perform communication with each other through a wired or wireless communication path 200. Although not specifically stated in the following description, it is assumed that transmission and reception of signals between the encoding device 100 and the decoding device 110 are performed through the communication path 200. It is also assumed that encoding and decoding processes that the encoding device 100 and the decoding device 110 perform in this embodiment are performed on the non-key frames described above.

A preprocessing device 120 performs Discrete Cosine Transform (DCT) on image data of an original image (one frame). The preprocessing device 120 also performs quantization for each frequency band and performs conversion of the image data into binary data (or digital data) to generate input bits as input data of the encoding device 100.

The encoding device 100 of this embodiment performs encoding based on the input bits and includes a coded bit storing part 102, a bit transmitting part 103, and a bit addition request receiving part 104.

The encoding part 101 performs an encoding process based on the input bits, generates a systematic code (including an image information bit and coded bits), and stores the coded bits in the coded bit storing part 102. Here, the encoding part 101 performs encoding based on the Slepian-Wolf theorem. This embodiment will be described with reference to the case where the encoding process is performed using a turbo code. Thus, the coded bits constitute a parity check code.

The coded bit storing part 102 is, for example, a buffer and temporarily stores coded bits of one frame generated by the encoding part 101. The bit transmitting part 103 performs a process for transmitting a signal including part of coded bits selected from the coded bits stored in the coded bit storing part 102 to the decoding device 110. The bit addition request receiving part 104 receives a bit addition request signal transmitted from the decoding device 110 and performs a process for causing the bit transmitting part 103 to again select and transmit coded bits for addition (which will also be referred to as "additional coded bits").

Here, each element of the encoding device 100 may be constructed as an independent processing unit (hardware). In this case, each element of the encoding device 100 may include input and output terminals and may perform transmission and reception of signals including data such as calculation results. However, the present invention is not limited to this configuration and, for example, one processing unit may perform processing of the elements of the encoding device 100 through software or the like.

The decoding device 110 includes a bit receiving part 111, a coded bit storing part 112, a decoding part 113, a prediction value generating part 114, a bit addition request determining part 115, a bit addition request transmitting part 116, and a preset value generating/updating part 117. The bit receiving part 111 performs a process for receiving a signal including coded bits transmitted from the encoding device 100 and storing the received coded bits in the coded bit storing part 112. The coded bit storing part 112 is, for example, a buffer and temporarily stores data of the received coded bits based on the processing of the bit receiving part 111.

Since the encoding part 101 performs an encoding process using a turbo code based on the Slepian-Wolf theorem, the decoding part 113 also performs a decoding process based on the turbo code. Therefore, the decoding part 113 has a plurality of decoders. Each decoder performs maximum a posteriori (MAP) decoding based on conditional probability (or posteriori probability) using an algorithm such as simplified Max-Log-MAP. The decoder performs an error correction decoding process based on an image information bit of a predicted image generated by the prediction value generating part 114 and a preset value updated or generated by the preset value generating/updating part 117 and performs decoding of the image information bit.

The prediction value generating part 114 performs a process for generating image data of the predicted image. The prediction value generating part 114 also performs a process for generating, as a predicted value, an image information bit of the predicted image based on the image data of the predicted image. For example, in the process for generating image data of the predicted image, the prediction value generating part 114 may determine image data of a previous frame to be the image data of the predicted image. For example, in the case where image data of a subsequent key frame is present, the prediction value generating part 114 may generate image data of the predicted image by calculating an average (or interpolated value) of positions (pixels) corresponding to image data in adjacent frames and determining the calculated average to be the image data of the predicted image. The prediction value generating part 114 may also generate image data of the predicted image by performing motion compensation using image data of adjacent frames.

The bit addition request determining part 115 determines, based on decoding result (i.e., the image information bit) from the decoding part 113, whether or not error correction has been satisfactorily performed based on the received coded bits so that the image information bit can be decoded and then determines whether or not to request the encoding device 100 to add coded bits. When the bit addition request determining part 115 has determined not to request the encoding device 100 to add coded bits, the bit addition request determining part 115 transmits a signal including the processed image information bit as a decoded bit to the image processing device 130. Here, since the preset value generating/updating part 117 performs a process for updating the preset value based on the result of the decoding process when the bit addition request determining part 115 has determined to request the encoding device 100 to add coded bits, it is assumed that the bit addition request determining part 115 of this embodiment includes a storing part (not shown) for storing the image information bit. When the bit addition request determining part 115 has determined to request the encoding device 100 to add coded bits, the bit addition request transmitting part 116 performs a process for transmitting a bit addition request signal to the encoding device 100.

The preset value generating/updating part 117 generates or updates a preset value that is initially set as a value indicating the degree of reliability of error correction applied when the decoding part 113 performs the decoding process. The preset value generating/updating part 117 generates and sets the preset value when the preset value is absent (i.e., when the preset value has not been set). In the case where coded bits requested by the bit addition request determining part 115 have been added and the decoding part 113 has performed a second or subsequent decoding process, the preset value generating/updating part 117 performs a process for updating and setting the preset value based on the result of the previous decoding process.

Here, each element of the decoding device 110 may also be constructed as an independent processing unit (hardware) or alternatively one processing unit may perform processing of the elements of the decoding device 110 through software or the like.

The image processing device 130 performs a process such as Inverse Discrete Cosine Transform (IDCT) based on the coded bits transmitted from the decoding device 110 to reproduce image data.

Although the encoding device 100 and the preprocessing device 120 are separate devices in this example, both may be constructed as a single device. The decoding device 110 and the image processing device 130 may also be constructed as a single device. Although not illustrated, devices for processing and encoding image data of a key frame may be constructed to be identical to the preprocessing device 120 and the encoding device 100. Devices for decoding and processing compressed image data may also be constructed to be identical to the decoding device 110 and the image processing device 130.

Figure 2:
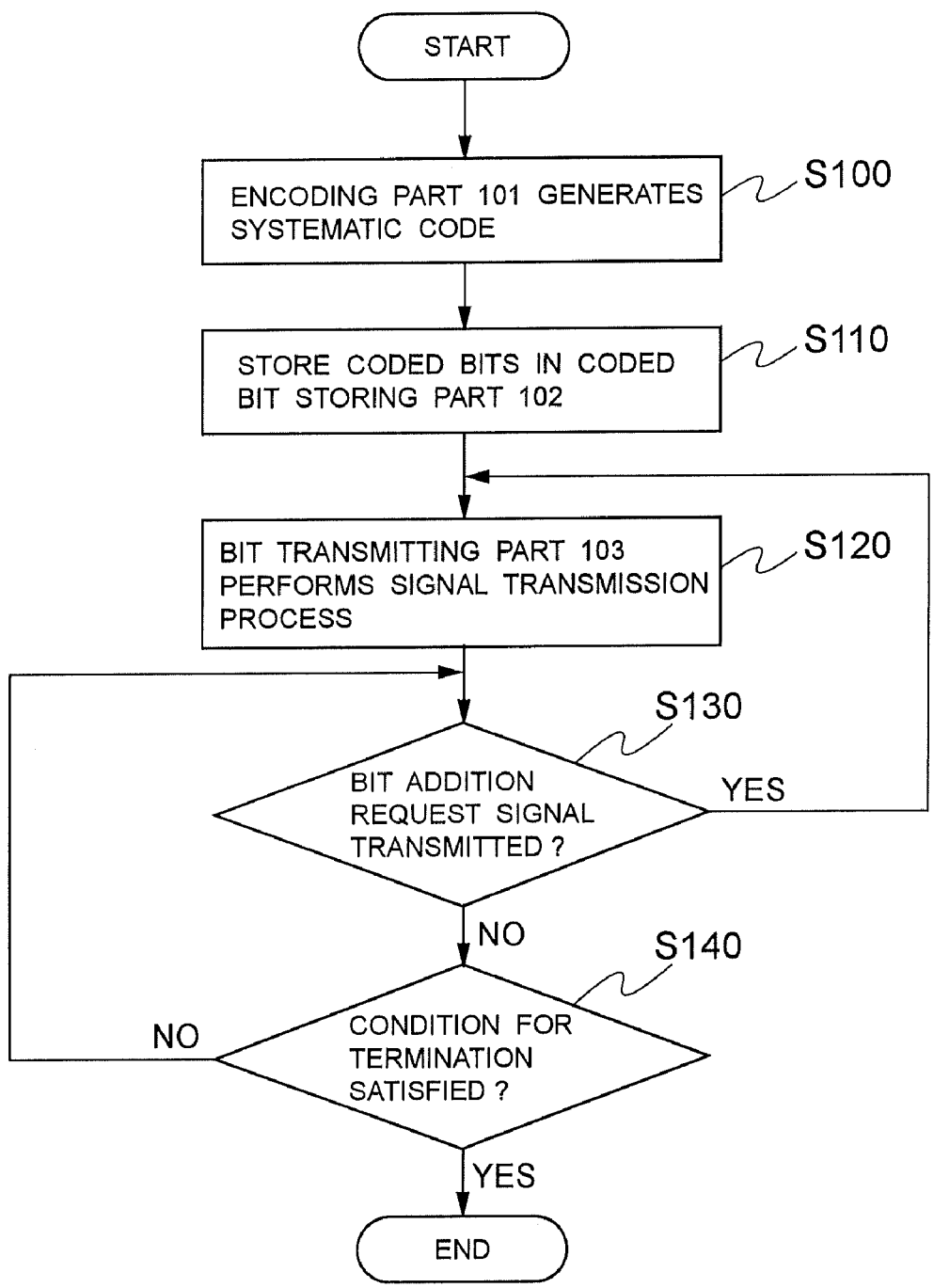
FIG. 2 is a flow chart of a procedure performed by an encoding device 100 of Embodiment 1.

FIG. 2 is a flow chart of a procedure performed by the encoding device 100 of Embodiment 1. The procedure performed by the encoding device 100 is described below with reference to FIG. 2. Input bits that the preprocessing device 120 generates by performing preprocessing are input to the encoding part 101. The encoding part 101 performs an encoding process using a turbo code to generate a systematic code (including an image information bit and coded bits that can be clearly discriminated) (S100). The encoding part 101 stores coded bits of one frame included in the systematic code in the coded bit storing part 102 (S110). The bit transmitting part 103 then transmits a signal including part of the coded bits stored in the coded bit storing part 102 to the decoding device 110 (S120).

The bit addition request receiving part 104 determines whether or not a bit addition request signal has been transmitted from the decoding device 110 (S130). When it is determined that a bit addition request signal has been transmitted from the decoding device 110 (i.e., received by the bit addition request receiving part 104), the bit addition request receiving part 104 returns to S120 to cause the bit transmitting part 103 to transmit a signal including part of coded bits for addition to the decoding device 110. When it is determined that a bit addition request signal has not been transmitted, the encoding device 100 determines whether or not a condition for terminating the procedure has been satisfied. When it is determined that the condition for terminating the procedure has been satisfied, the encoding device 100 terminates the procedure for the frame (S140). Although the condition for terminating the procedure is not described in this embodiment, for example, time measurement may be performed using a timer or the like (not shown) and reception of a signal indicating completion of decoding, the signal including a code having no bit addition request, from the decoding device 110 within a predetermined time measured through the timer may be used as the condition for terminating the procedure.

Figure 3:
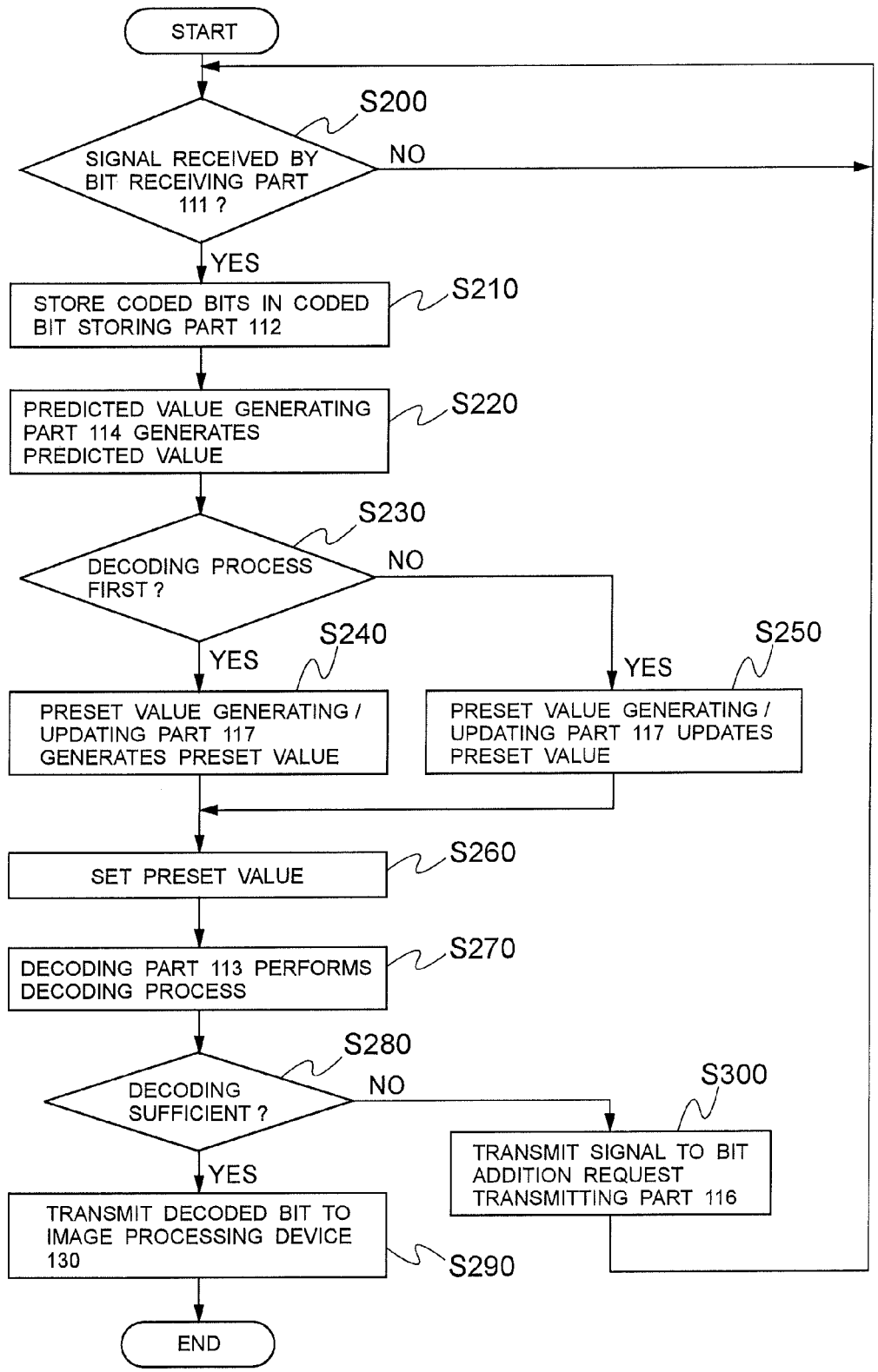
FIG. 3 is a flow chart of a procedure performed by a decoding device 110 of Embodiment 1.

FIG. 3 is a flow chart of a procedure performed by the decoding device 110 of Embodiment 1. The procedure performed by the decoding device 110 is described below with reference to FIG. 3. When the bit receiving part 111 has received a signal including coded bits transmitted from the encoding device 100 (S200), the bit receiving part 111 stores the received coded bits in the coded bit storing part 112 (S210).

The prediction value generating part 114 generates image data of a predicted image and generates a predicted value that the decoding part 113 uses to perform processing (S220). In one method, image data of a previous frame may be used as the predicted image as described above.

The preset value generating/updating part 117 performs a process for generating or updating a preset value. First, the preset value generating/updating part 117 determines whether or not the decoding process performed by the decoding part 113 is a first decoding process (whether or not a request for addition of coded bits has been made) (S230). If it is determined that the decoding process is the first, the preset value generating/updating part 117 performs generation of a preset value using the first decoding process (S240) and performs setting of the generated preset value (S260). For example, "0" is generated as the preset value in the case of log-likelihood ratio (LLR).

On the other hand, if it is determined that the decoding process performed by the decoding part 113 is not the first (i.e., it is a second or subsequent decoding process since coded bits have been added), the preset value generating/updating part 117 performs an updating process based on data of the decoding result stored in the bit addition request determining part 115 (for example, the result of the first decoding process in the case where the second decoding process is performed) (S250) and performs setting of the updated preset value (S260). For example, in the case where the unit of data of the image information bit is one bit frame, the preset value generating/updating part 117 may calculate a preset value in a lower bit frame based on the result of decoding of a higher bit frame and updates the preset value using the updated preset value. Here, the coded bit reception process, the preset value generation process, and the preset value generation/update process may be performed in a different order from the order described above and may also be performed in parallel.

The decoding part 113 performs a decoding process associated with a turbo code (error correction code) based on the preset value generated or updated by the preset value generating/updating part 117, the image information bit of the predicted image generated by the prediction value generating part 114, and the coded bits stored in the coded bit storing part 112 (S270) and transmits data generated as the result of the decoding process to the bit addition request determining part 115.

The bit addition request determining part 115 determines whether or not decoding is sufficient based on data generated by the decoding process of the decoding part 113 (S280). When it is determined that decoding is sufficient, the bit addition request determining part 115 transmits decoded bits to the image processing device 130 (S290) and terminates the procedure for the frame.

When it is determined that decoding is not sufficient, the bit addition request determining part 115 instructs the bit addition request transmitting part 116 to make a request to add coded bits and the bit addition request transmitting part 116 then transmits a bit addition request signal to the encoding device 100 (S300) and the procedure then returns to step S200. The above procedure continues until it is determined that decoding is sufficient.

In the coding system of Embodiment 1, the preset value generating/updating part 117 in the decoding device 110 determines whether or not the decoding process performed by the decoding part 113 is the first and updates a preset value used for repeated decoding based on the result of the previous decoding process if it is determined that the decoding process is a second or subsequent decoding process (i.e., if it is determined to perform a decoding process with added coded bits) and the decoding part 113 then performs a decoding process using the updated preset value as described above. Therefore, it is possible to perform the second or subsequent decoding process using a preset value that is more reliable than the initially generated and set preset value. Accordingly, in the case where repeated feedback-based decoding such as turbo code-based decoding is performed, it is possible to achieve fast convergence of decoding and therefore it is possible to reduce the amount of the decoding process performed by the decoding part 113 and to reduce processing time. In addition, since the probability of feedback is reduced, it is also possible to significantly reduce the overall decoding process and to reduce the number of coded bit addition requests, thereby maintaining the frame rate. This is effective especially when maximum a posteriori (MAP) decoding is performed using a turbo code based on the Slepian-Wolf theorem.

Embodiment 2

Figure 4:
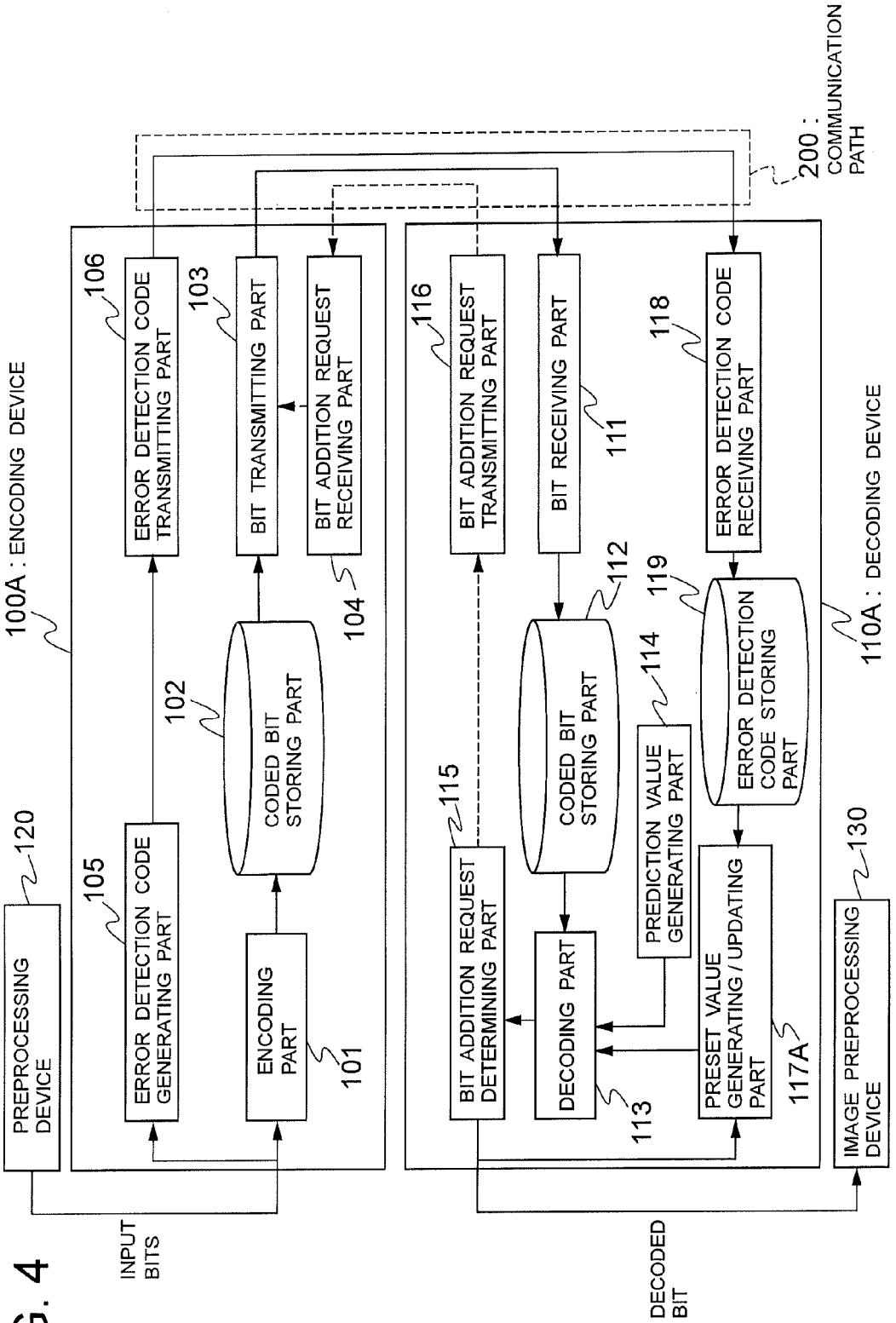
FIG. 4 illustrates a configuration of a coding system according to Embodiment 2.

FIG. 4 illustrates a configuration of a coding system according to Embodiment 2 of the present invention. In the coding system shown in FIG. 4, elements, which are denoted by the same reference numerals as those of FIG. 1, operate in the same manner as described above in Embodiment 1.

As shown in FIG. 4, an encoding device 100A differs from the encoding device 100 of Embodiment 1 in that the encoding device 100A includes an error detection code generator 105 and an error detection code transmitting part 106. The error detection code generator 105 which is an error code generator performs a process for generating an error detection code based on input bits. Here, the error detection code is a code erroneous data having less than a predetermined number of bits such as a checksum or Cyclic Redundancy Check (CRC) code. The error detection code transmitting part 106 performs a process for transmitting a signal including the error detection code generated by the error detection code generator 105 to a decoding device 110A.

As shown in FIG. 4, the decoding device 110A differs from the decoding device 110 of the Embodiment 1 in that the decoding device 110A includes an error detection code receiver 118, an error detection code storing part 119, and a preset value generating/updating part 117A. The error detection code receiver 118 performs a process for receiving a signal including the error detection code transmitted from the encoding device 100A and storing the same in the error detection code storing part 119. The error detection code storing part 119 is, for example, a buffer and temporarily stores data of the received error detection code based on processing of the error detection code receiver 118.

The preset value generating/updating part 117A is similar to the preset value generating/updating part 117 described in Embodiment 1 in that the preset value generating/updating part 117A performs a process for generating or updating the preset value. However, the preset value generating/updating part 117A of this embodiment differs from the preset value generating/updating part 117 in that the preset value generating/updating part 117A detects the number of errors that have not been corrected in the result of the decoding process based on the error detection code stored in the error detection code storing part 119 and determines whether or not to perform a process for updating the preset value based on the number of errors.

Figure 5:
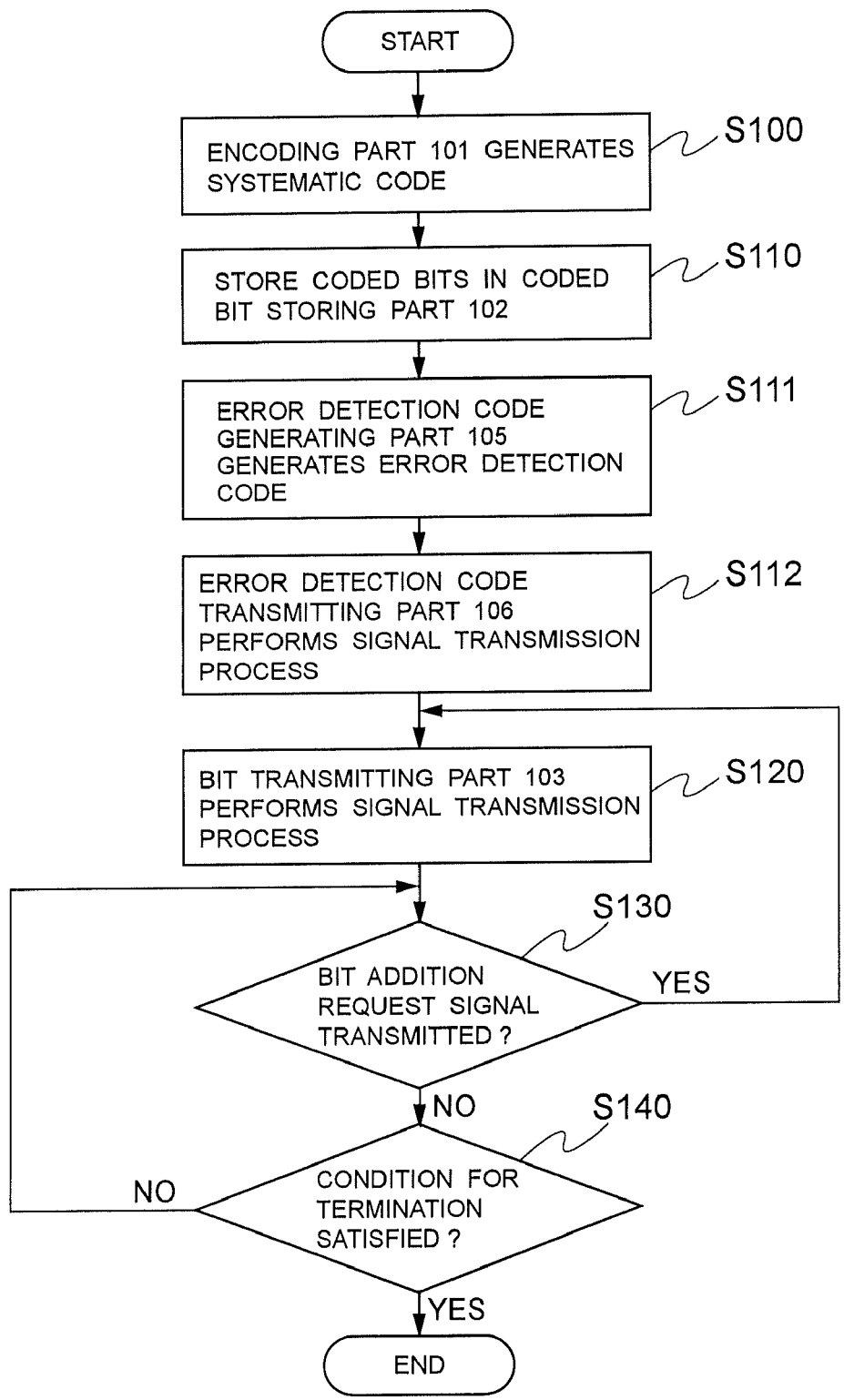
FIG. 5 is a flow chart of a procedure performed by an encoding device 100A of Embodiment 2.

FIG. 5 is a flow chart of a procedure performed by the encoding device 100A of Embodiment 2. With reference to FIG. 5, a description is given below of the procedure performed by the encoding device 100A, mainly of portions thereof different from the procedure of the encoding device 100 of Embodiment 1. In the encoding device 100A, the encoding part 101 performs an encoding process and stores coded bits of one frame in the coded bit storing part 102 (S100, S110). The error detection code generator 105 generates an error detection code based on input bits (S111). The error detection code transmitting part 106 transmits a signal including the error detection code to the decoding device 110 (S112). The bit transmitting part 103 transmits a signal including part of the coded bits to the decoding device 110 (S120). The subsequent procedure is similar to that described in Embodiment 1. Here, the coded bits generation process and the error detection code generation process may be performed in a different order from the order described above and may also be performed in parallel.

Figure 6:
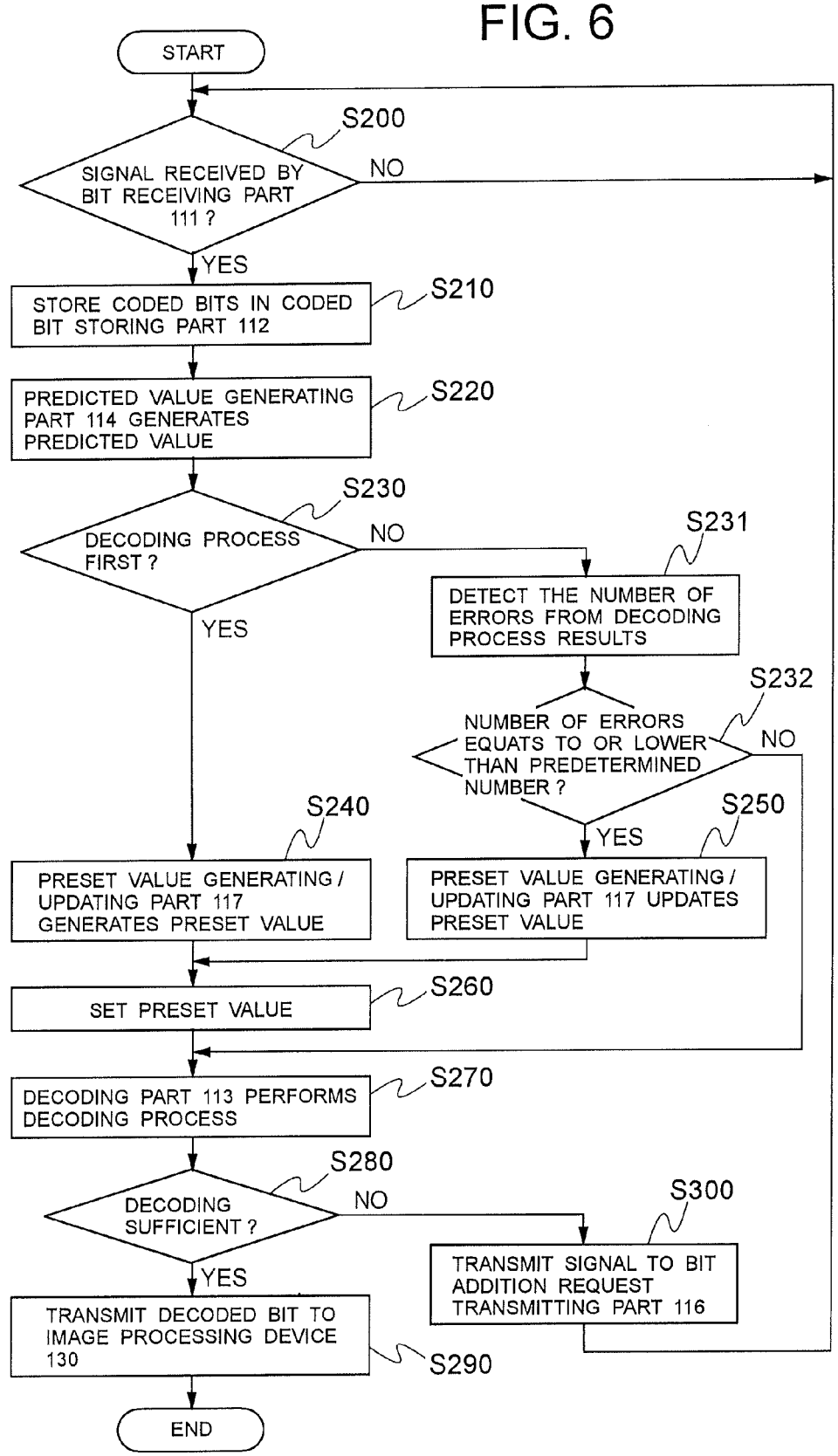
FIG. 6 is a flow chart of a procedure performed by a decoding device 110A of Embodiment 2.

FIG. 6 is a flow chart of a procedure performed by the decoding device 110A of Embodiment 2. With reference to FIG. 6, a description is given below of the procedure performed by the decoding device 110A, mainly of portions thereof different from the decoding device 110 of Embodiment 1. In the decoding device 110A, when the prediction value generating part 114 generates a predicted value (S220), the error detection code receiver 118 receives a signal including error detection code data from the error detection code transmitting part 106 (S221) and stores the error detection code data in the error detection code storing part 119 (S222).

When the preset value generating/updating part 117 has determined that the decoding process performed by the decoding part 113 is not the first (S230), the number of errors that have failed to be corrected in the resulting data of the decoding process is detected based on the error detection code stored in the error detection code storing part 119 and the resulting data of the decoding process stored in the bit addition request determining part 115 (S231). It is then determined whether or not the detected number of errors is equal to or less than a preset number (S232). If the detected number of errors is equal to or less than the preset number, a process for updating a preset value is performed (S250) and the updated preset value is set (S260).

On the other hand, when it is determined that the detected number of errors is greater than the preset number, updating and setting of the preset value are not performed. Although whether or not the preset value update process is performed is determined based on the number of errors in this example, an error rate may be calculated from the number of errors and the determination may then be made based on the error rate. The subsequent procedure is similar to that of the decoding device 110 described in Embodiment 1.

As described above, in the coding system of Embodiment 2, the encoding device 100A generates an error detection code based on input bits and transmits the error detection code to the decoding device 110A and the preset value generating/updating part 117 in the decoding device 110 detects the number of errors which have failed to be corrected in the result of the decoding process based on the error detection code and determines whether or not to perform the preset value update process based on the number of errors. Therefore, it is possible to update and set a preset value that is more reliable than the preset value that has been previously set. Accordingly, it is possible to reduce the amount of the decoding process performed by the decoding part 113 and to reduce processing time.

Embodiment 3

Figure 7:
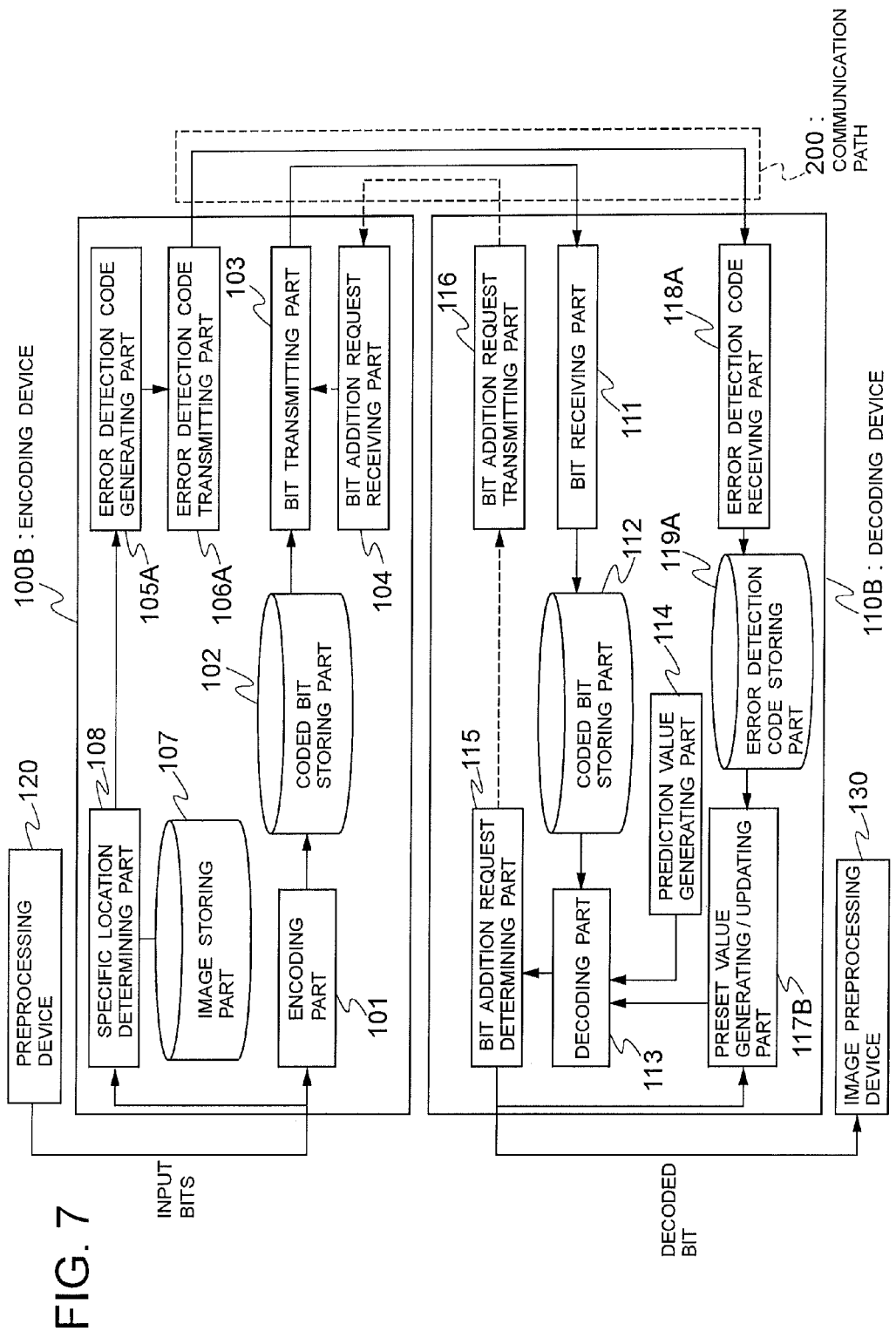
FIG. 7 illustrates a configuration of a coding system according to Embodiment 3 of the present invention.

FIG. 7 illustrates a configuration of a coding system according to Embodiment 3 of the present invention. In the coding system shown in FIG. 7, elements, which are denoted by the same reference numerals as those of FIGS. 1 and 4, operate in the same manner as described above in Embodiment 1 or 2.

As shown in FIG. 7, an encoding device 100B differs from the encoding device 100A of Embodiment 2 in that the encoding device 100B includes an image storing part 107 and a specific location determining part 108. The image storing part 107 is, for example, a buffer and, for example, temporarily stores an image information bit of an image of a key frame before and/or after a processing target frame, an image information bit of an image to be reproduced, or the like. The specific location determining part 108 performs a process for determining a specified location such as a location which has undergone a great change based on the image information bit stored in the image storing part 107 or the input bits. For example, the specific location determining part 108 calculates a difference between the image information bit stored in the image storing part 107 and an image information bit of the input bits and determines that a location at which the calculated difference is greater than a predetermined threshold is the specified location.

An error detection code generator 105A performs a process for generating an error detection code at the specific location determined by the specific location determining part 108. An error detection code transmitting part 106A transmits a signal including data indicating the specific location and the error detection code.

On the other hand, in the decoding device 110B, an error detection code receiver 118A performs a process for receiving a signal including data indicating the specific location and the error detection code and storing data of the received signal in an error detection code storing part 119B. A preset value generating/updating part 117B detects the number of errors of the specific location in the decoding process result based on the data indicating the specific location and the error detection code stored in the error detection code storing part 119A and determines whether or not to perform a process for updating the preset value.

FIG. 8 is a flow chart of a procedure performed by the decoding device 110B of Embodiment 3. With reference to FIG. 8, a description is given below of the procedure performed by the encoding device 100B, mainly of portions thereof different from the encoding devices 100 and 100A of Embodiments 1 and 2. In the encoding device 100B, the encoding part 101 performs an encoding process and stores coded bits of one frame in the coded bit storing part 102 (S100 and S110).

The image storing part 107 stores an image information bit associated with an image that the specific location determining part 108 uses for determining the specific location (S113). The specific location determining part 108 determines the specific location as described above based on the image information bit stored in the image storing part 107 and the input bits (S114). The error detection code generator 105A then generates an error detection code based on the input bits of the specific location (S115). The error detection code transmitting part 106A then transmits a signal including data indicating the specific location and the error detection code associated with the specific location to the decoding device 110B (S116). The subsequent procedure is similar to that described above in Embodiment 1.

The flow of the procedure of the decoding device 110B is basically identical to that of FIG. 6. A description is given below of a procedure performed by the preset value generating/updating part 117B of this embodiment in the procedure for detecting the number of errors performed at step S231 of FIG. 6.

The preset value generating/updating part 117B detects the number of errors at the specific location based on the data of the decoding process result stored in the bit addition request determining part 115 and the error detection code stored in the error detection code storing part 119A. For example, let us assume that errors have occurred in 10 bits among 1000 bits at the specific location. On the other hand, let us assume that no errors have occurred in 9000 bits at non-specific locations. For example, the total error rate is tentatively calculated as an error rate of $10^{-3}$ (=10/(1000+9000)). Although it is assumed here that the number of errors at the non-specific locations is 0, it is also possible to assume that the number of errors at the non-specific locations is nonzero. Whether or not the preset value update process is performed is determined based on the calculated error rate.

In the coding system of Embodiment 3, the specific location determining part 108 in the encoding device 100B previously specifies a location at which errors easily occur and generates an error detection code of the specific location and transmits a signal including data indicating the specific location to the decoding device 110B. Thus, error detection coding is applied only to the location at which errors easily occur (for example, a location at which the difference with image information of a previous frame is great or a location with rapid motion changes) and an error detection code is transmitted only for the location. Accordingly, the system of Embodiment 2 can also significantly reduce the amount of transmission of a signal associated with the error detection code. Therefore, it is possible to increase the overall compression ratio while allowing the decoding device 110B to update and set a highly reliable preset value.

Embodiment 4

While the above embodiments have been described with reference to the case where encoding and decoding processes are performed using a turbo code, the present invention is not limited to such a case. For example, encoding and decoding processes may also be performed using a Low-Density Parity-Check (LDPC) code. In this case, the coded bits generated through the process are syndrome bits.

Embodiment 5

Although the error detection code generators 105 and 105A, the error detection code transmitting parts 106 and 106A, the error detection code receivers 118 and 118A, and the error detection code storing parts 119 and 119A are provided to generate an error detection code in Embodiments 2 and 3, it is also possible to apply an error correction code. For example, in the case where an error correction code, the number of bits of which is equal to or less than a predetermined number, is used, it is possible, in many cases, to perform error detection of bits, the number of which is equal to or less than the predetermined number plus 1 and thus it is possible to use the error correction code in place of the error detection code. Here, although it is also possible to use coded bits generated through the encoding process of the encoding part 101 instead of the error detection code, it is not necessary to use a highly reliable error correction code such as the coded bits since the preset value generating/updating part 117As and 117B use it only to determine whether or not to perform the update process.

In Embodiment 3, it is possible not only to determine the specific location in units of pixels but also to determine the specific location in units of, for example, blocks of 4 pixels×4 lines. When the specific location is determined in units of blocks, the compression ratio is increased since the amount of data is increased.

Although the above embodiments have been described with reference to procedures performed on moving images, data on which encoding and decoding are performed is not limited to images. For example, when a data group divided into key data and non-key data is defined, it is possible to apply a coding system including the encoding and decoding devices of the present invention to the non-key data.

The present application is based on Japanese Patent Application No. 2009-063796 which is incorporated herein by reference.

What is claimed is:

1. A decoding device that performs data reproduction by performing error correction of predicted data using coded data, the decoding device comprising:
    a coded data receiver that receives a first signal including transmitted first coded data, which includes a first error correction code based on original data;
    a prediction value generating part that generates predicted data;
    a preset value generating/updating part that performs a process for generating or updating a preset value indicating a degree of reliability of error correction;
    a decoding part that performs a decoding process based on the preset value and the predicted data, and the first coded data; and
    an addition request determining part that performs a process for determining whether or not there is a need to request second coded data based on a result of the decoding process of the decoding part,
    wherein the preset value generating/updating part performs the process for updating the preset value based on a result of a previous decoding process if the decoding part determines to perform a decoding process with the second coded data.

2. The decoding device according to claim 1, wherein the decoding part performs a decoding process using MAP decoding.

3. The decoding device according to claim 1, wherein the decoding part performs a decoding process based on a Slepian-Wolf theorem.

4. The decoding device according to claim 1, wherein the decoding part performs a decoding process using a turbo code.

5. The decoding device according to claim 1, wherein the decoding part performs a decoding process using a Low-Density Parity-Check (LDPC) code.

6. The decoding device according to claim 1, further comprising an error detection code receiver that receives a second signal including an error detection code generated based on the original data,
    wherein the preset value generating/updating part performs a process for detecting an error in the result of the previous decoding process based on the error detection code and performs the process for updating the preset value when it is determined that the error is small based on the number of errors or an error rate.

7. The decoding device according to claim 6, wherein the error detection code is associated with data of a specified part of the original data and includes data regarding the data of the specified part, and
    the preset value generating/updating part performs an error detection process on data in the result of the previous decoding process corresponding to the data of the specified part, based on the error detection code.

8. A coding system comprising:
    the decoding device according to claim 6; and
    an encoding device, including
        an encoding part that performs a generating process for generating the first coded data,
        a coded data transmitting part that performs a transmitting process for transmitting the first signal to the decoding device and transmitting an additional signal including the second coded data based on an addition request from the decoding device,
        an error code generator that performs a generating process for generating an error code that is one of
            a second error correction code for error detection, and
            the error detection code based on the original data, and
        an error code transmitting part that performs a transmitting process for transmitting the error code generated by the error code generator.

9. A coding system comprising:
    the decoding device according to claim 7; and
    an encoding device, including
        an encoding part that performs a generating process for generating the first coded data,
        a specific location determining part that specifies data of part of the original data,
        a coded data transmitting part that performs a transmitting process for transmitting the first signal to the decoding device and transmitting an additional signal including the second coded data based on an addition request from the decoding device,
        an error code generator that performs a generating process for generating an error code that is one of
            a second error correction code for error detection, and
            the error detection code based on the data of the part specified by the specific location determining part, and
        an error code transmitting part that performs a transmitting process for transmitting the second signal including data regarding the data of the specified part together with the error code generated by the error code generator.

10. A coding system comprising:
    the decoding device according to claim 1; and
    an encoding device including an encoding part that performs a generating process for generating the first coded data, and a coded data transmitting part that performs a transmitting process for transmitting the first signal to the decoding device and transmitting an additional signal including the second coded data based on an addition request from the decoding device.

* * * * *